(12) United States Patent
Toyota (10) Patent No.: US 11,830,847 B2
(45) Date of Patent: Nov. 28, 2023

(54) MANUFACTURING METHOD OF SEMICONDUCTOR DEVICE AND SEMICONDUCTOR DEVICE

(71) Applicant: Kioxia Corporation, Tokyo (JP)

(72) Inventor: Gen Toyota, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 1 day.

(21) Appl. No.: 17/409,499

(22) Filed: Aug. 23, 2021

(65) Prior Publication Data

US 2022/0077106 A1     Mar. 10, 2022

(30) Foreign Application Priority Data

Sep. 10, 2020   (JP) .................................. 2020-152137

(51) Int. Cl.
*H01L 23/00* (2006.01)
*H01L 25/065* (2023.01)
*H01L 25/00* (2006.01)

(52) U.S. Cl.
CPC .............. *H01L 24/83* (2013.01); *H01L 24/29* (2013.01); *H01L 24/32* (2013.01); *H01L 25/0657* (2013.01); *H01L 25/50* (2013.01); *H01L 2224/2919* (2013.01); *H01L 2224/32145* (2013.01); *H01L 2224/83047* (2013.01)

(58) Field of Classification Search
CPC ................. H01L 24/29; H01L 25/0657; H01L 2224/2919
See application file for complete search history.

(56) References Cited

U.S. PATENT DOCUMENTS

| 7,195,988 | B2 | 3/2007 | Nemoto et al. |
| 8,395,166 | B2 * | 3/2013 | Seo ...................... H01L 25/0753 |
| | | | 257/91 |
| 8,859,391 | B2 | 10/2014 | Matsugai |
| 8,883,613 | B2 | 11/2014 | Owada |
| 2009/0140405 | A1 * | 6/2009 | Maruo ..................... H01L 23/10 |
| | | | 257/E23.18 |
| 2012/0211849 | A1 * | 8/2012 | Matsugai ............... H01L 27/146 |
| | | | 438/455 |
| 2017/0076969 | A1 | 3/2017 | Shirono et al. |

FOREIGN PATENT DOCUMENTS

| JP | 2005-026413 | 1/2005 |
| JP | 2006-295030 | 10/2006 |
| JP | 2012-174937 | 9/2012 |
| JP | 2013-131652 | 7/2013 |
| JP | 2017-055089 A | 3/2017 |

* cited by examiner

*Primary Examiner* — Dale E Page
*Assistant Examiner* — Wilner Jean Baptiste
(74) *Attorney, Agent, or Firm* — Foley & Lardner LLP (57) ABSTRACT

According to one embodiment, a manufacturing method of a semiconductor device is provided. The manufacturing method includes removing a portion of an edge region from a front surface of a first substrate to form a notch in the edge region; bonding the front surface of the first substrate and a front surface of a second substrate together to form a stacked substrate, wherein the stack substrate includes an opening at a position corresponding to the notch; and filling the opening with an embedding member.

8 Claims, 8 Drawing Sheets

MANUFACTURING METHOD OF SEMICONDUCTOR DEVICE AND SEMICONDUCTOR DEVICE

CROSS-REFERENCE TO RELATED APPLICATION

This application is based upon and claims the benefit of priority from Japanese Patent Application No. 2020-152137, filed Sep. 10, 2020, the entire contents of which are incorporated herein by reference.

FIELD

Embodiments described herein relate generally to a manufacturing method of a semiconductor device and a semiconductor device.

BACKGROUND

A semiconductor device may be manufactured as a stacked substrate by bonding the front surfaces of two substrates to each other and polishing the back surface of one substrate. In general, it is desired to reduce the maintenance burden on an apparatus that manufactures such a semiconductor device.

DETAILED DESCRIPTION

Embodiments provide a manufacturing method of a semiconductor device, which is suitable for reducing the maintenance burden of a manufacturing apparatus, and a semiconductor device.

In general, according to one embodiment, a manufacturing method of a semiconductor device is provided. The manufacturing method includes removing a portion of an edge region from a front surface of a first substrate to form a notch in the edge region; bonding the front surface of the first substrate and a front surface of a second substrate together to form a stacked substrate, wherein the stack substrate includes an opening at a position corresponding to the notch; and filling the opening with an embedding member.

The semiconductor device according to the embodiment will be described in detail with reference to the accompanying drawings below. The present disclosure is not limited to this embodiment.

First Embodiment

The manufacturing method of the semiconductor device according to a first embodiment is a manufacturing method of a semiconductor device as a stacked substrate. In the manufacturing method of the semiconductor device, the front surfaces of two substrates are directly bonded to each other by a bonding device. In the direct bonding, the front surfaces of the two substrates are each activated by using plasma or the like and are directly bonded without using an adhesive or the like. Then, the back surface of one of the substrates is polished by a polishing device. At this time, since the end surface of the substrate is a curved surface, a knife edge (first knife edge) having a substantially knife shape in cross-sectional view may be generated in the vicinity of the end portion of the polished surface on the substrate as the polishing progresses. Since the first knife edge is weak in strength, the first knife edge can be easily chipped and scattered as scraps (first scraps) in the polishing device. This can increase the maintenance burden such as cleaning of the polishing device.

In order to avoid turning the first knife edge into scraps, it is conceivable to perform pre-trimming by removing the edge portion of the front surface of one of the substrates in advance before bonding. In this case, the peripheral edge portion of one substrate is partially removed from the front surface side to form a notch portion in the peripheral edge region on the front surface of the one substrate. The front surfaces of the two substrates are directly bonded to each other by the bonding device and the back surface of one of the substrates is polished by the polishing device. As the polishing progresses, a knife edge (second knife edge) having a substantially knife shape in cross-sectional view may be generated between the polished surface and the notch portion. Since the second knife edge is weak in strength, the second knife edge can be easily chipped and scattered as scraps (second scraps) in the polishing device.

That is, by performing the pre-trimming process, it is possible to avoid turning the first knife edge into scraps, but the second knife edge is newly generated, which causes second scraps to be scattered in the polishing device. This can increase the maintenance burden such as cleaning of the polishing device.

Therefore, in the present embodiment, in the manufacturing method of the semiconductor device, a pre-trimming process for forming a notch portion in a peripheral edge region of one substrate surface is performed and the two substrates are bonded to form a stacked substrate. Thereafter, by filling the opening formed on the side surface of the stacked substrate with an embedding member according to the notch portion, it is possible to prevent the second knife edge from turning into scraps in the subsequent polishing process and reduce the maintenance burden on the manufacturing apparatus.

Specifically, a semiconductor device 1 can be manufactured as shown in FIGS. 1A to 3B.

FIGS. 1A to 3B are process cross-sectional views showing a manufacturing method of the semiconductor device 1, respectively. In the following, the direction perpendicular to a back surface 110b of a substrate 110 is defined as the Z direction, and the two directions orthogonal to each other in the plane perpendicular to the Z direction are defined as the X direction and the Y direction.

Figure 1A:
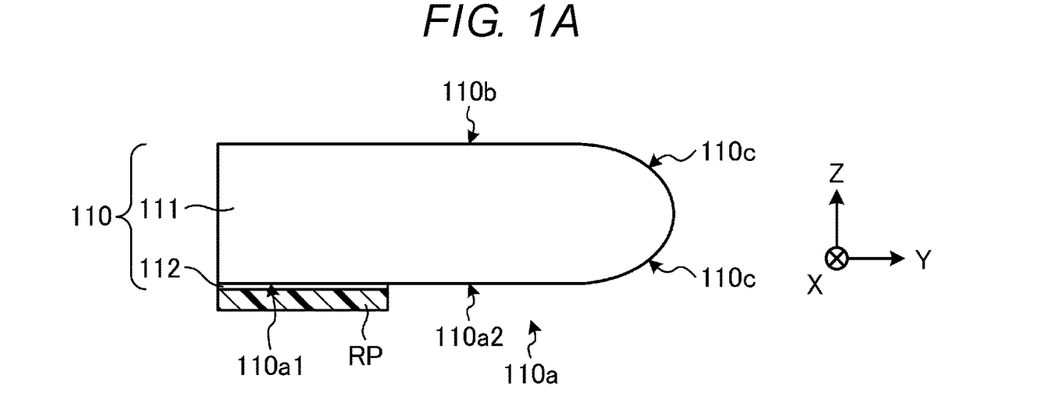
FIGS. 1A to 1C are cross-sectional views showing a manufacturing method of a semiconductor device according to a first embodiment.

In the process shown in FIG. 1A, the substrate 110 is prepared. The substrate 110 has a substantially disk shape and has a substantially circular shape in an XY plan view. The substrate 110 includes a front surface 110a on the −Z side, a back surface 110b on the +Z side, and a curved end surface 110c on the outer side of the front surface 110a and the back surface 110b in the XY directions. The front surface 110a includes a main region 110a1 and a peripheral edge region 110a2. The peripheral edge region 110a2 is an annular region disposed outside the main region 110a1 and surrounds the main region 110a1 in the XY plan view. In the YZ cross-sectional view, the curved end surface 110c extends from the end portion of the front surface 110a while curving outward in the +Z direction and the XY directions, and then extends to the end portion of the back surface 110b while curving inward in the +Z direction and the XY directions.

The substrate 110 includes a base portion 111 and a device portion 112. The base portion 111 is made of a material containing a semiconductor (for example, silicon) as a main component. The device portion 112 is disposed in the main region 110a1 of the front surface 110a. The device portion 112 is a region in which a device pattern is formed, and includes a conductive pattern formed of a conductive film and an interlayer insulating film that fills the periphery thereof.

Figure 1B:
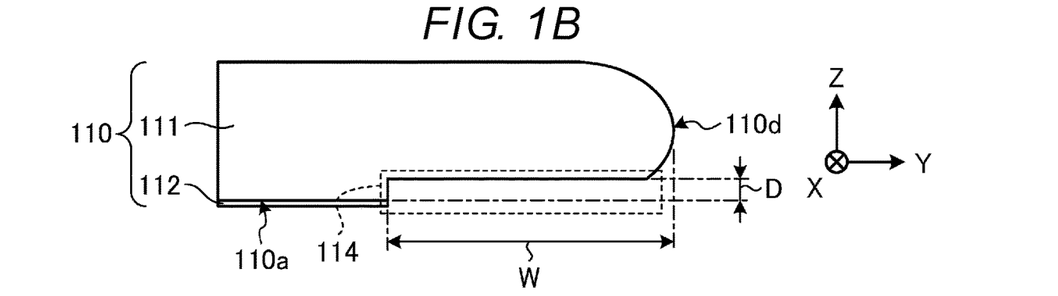

In the process shown in FIG. 1B, a pre-trimming process is performed. A resist pattern RP that selectively covers the main region 110a1 of the substrate 110 is generated. The resist pattern RP may be formed to selectively cover the main region 110a1 by applying a photosensitive material, exposing and developing the photosensitive material. By performing dry etching with an RIE device or the like using the resist pattern RP as a mask, the portion of the peripheral edge region 110a2 of the substrate 110 is partially removed from the front surface 110a side. As a result, a notch portion 114 is formed in the peripheral edge region 110a2 of the base portion 111 of the substrate 110.

Here, the notch portion 114 is formed to have the depth D from the front surface 110a of the substrate 110 of 10 μm or more and the minimum plane width W from the end portion 110d of the substrate 110 of 100 μm or more in cross-sectional view (YZ cross-sectional view in FIGS. 1A to 1C) that passes through the center of the substrate 110 and is perpendicular to the front surface 110a of the substrate 110.

The dimension of the notch portion 114 may be measured by using a length measuring SEM (CD-SEM: Critical Dimension-Scanning Electron Microscope), a cross section SEM, a cross section TEM (Transmission Electron Microscope), or the like.

Assuming that the depth D of the notch portion 114 is less than 10 μm or the minimum plane width W from the end portion 110d is less than 100 μm. In this case, when an opening 141 formed on the side surface of the stacked substrate according to the notch portion 114 is filled with an embedding member 130 (see FIG. 2A) in a later process, the embedding member 130 may not be sufficiently filled in the opening 141. For example, if a substance having a low viscosity is used for the embedding member 130, the embedding member can be temporarily filled in the opening 141. However, in a subsequent process such as heat treatment, slimming due to evaporation or the like may occur, and the opening 141 may not be filled with the embedding member 130. Further, if a substance having a high viscosity is used for the embedding member 130 and the depth D is less than 10 μm, the embedding member is difficult to enter the opening 141, and it is difficult to fill the opening 141 with the embedding member. Further, if the minimum plane width W is smaller than 100 μm, it becomes difficult to provide the contact area with the knife edge that may occur in the subsequent polishing process, and a knife edge KE1 (see FIG. 2B) is difficult to be supported with sufficient strength.

On the other hand, assuming that the depth D of the notch portion 114 is 10 μm or more and the minimum plane width W from the end portion 110d is 100 μm or more. In this case, when the opening 141 formed on the side surface of the stacked substrate according to the notch portion 114 is filled with the embedding member 130 (see FIG. 2A) in a later process, the embedding member 130 of an appropriate material can be sufficiently filled in the opening 141. For example, a highly viscous substance may be used for the embedding member 130 and the opening 141 can be filled with the embedding member 130, slimming is unlikely to occur in a process such as heat treatment, and the state in which the embedding member 130 is filled in the opening 141 can be maintained.

The upper limit of the depth D of the notch portion 114 may be freely determined within a range smaller than the thickness of the substrate 110, and may be, for example, 250 μm or less. Further, the upper limit of the minimum plane width W from the end portion 110d of the notch portion 114 may be freely determined within a range not reaching the device portion 112, and may be, for example, 5000 μm or less.

Figure 1C:
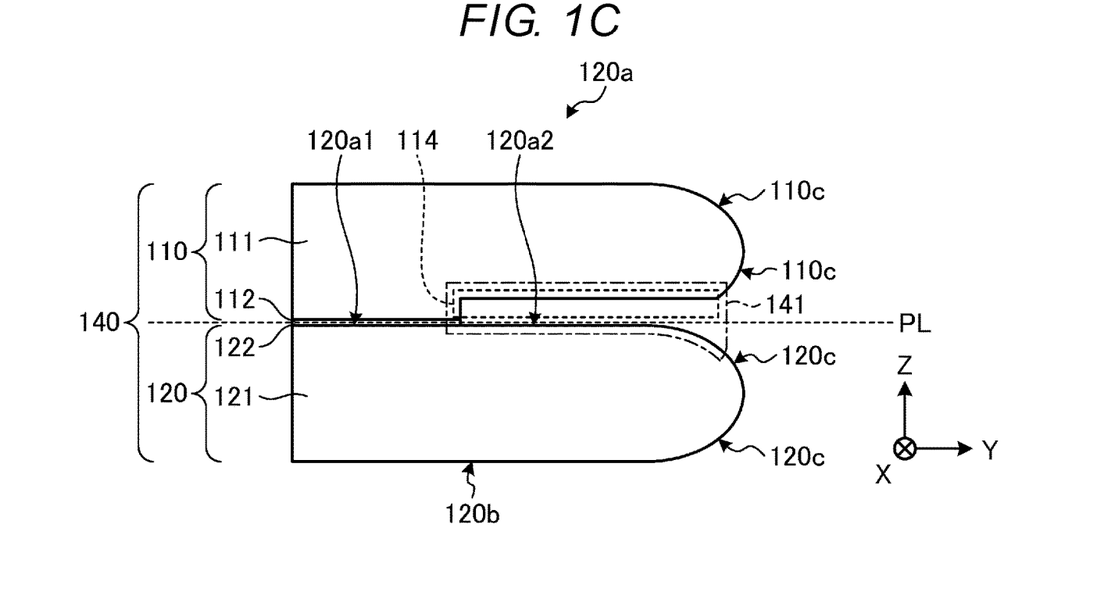

In the process shown in FIG. 1C, another substrate 120 is prepared. The substrate 120 has a substantially disk shape and has a substantially circular shape in an XY plan view. The substrate 120 includes a front surface 120a on the +Z side, a back surface 120b on the −Z side, and a curved end surface 120c on the outer side of the front surface 120a and the back surface 120b in the XY directions. The front surface 120a includes a main region 120a1 and a peripheral edge region 120a2. The peripheral edge region 120a2 is an annular region disposed outside the main region 120a1 and surrounds the main region 120a1 in the XY plan view. In the YZ cross-sectional view, the curved end surface 120c extends from the end portion of the front surface 120a while curving outward in the −Z direction and the XY directions, and then extends to the end portion of the back surface 120b while curving inward in the −Z direction and the XY directions.

The substrate 120 includes a base portion 121 and a device portion 122. The base portion 121 is made of a material containing a semiconductor (for example, silicon) as a main component. The device portion 122 is disposed in the main region 120a1 of the front surface 120a. The device portion 122 is a region in which a device pattern is formed, and includes a conductive pattern formed of a conductive film and an interlayer insulating film that fills the periphery thereof.

Then, after the front surface 110a of the substrate 110 and the front surface 120a of the substrate 120 are each activated by plasma or the like, the front surface 110a of the substrate 110 and the front surface 120a of the substrate 120 are bonded by direct bonding as shown in FIG. 1C. As a result, a stacked substrate 140 is formed. In the stacked substrate 140, the surfaces corresponding to the front surface 110a of the substrate 110 and the front surface 120a of the substrate 120 become a bonded surface PL as shown by the dotted line.

At this time, an opening 141 corresponding to the notch portion 114 is formed in the vicinity of the peripheral edge regions 110a2 and 120a2 on the bonded surface PL. The opening 141 is disposed on the side surface of the stacked substrate 140 over the entire circumference and opens laterally. The opening 141 has a larger outer Z dimension than the inner Z dimension. The opening 141 has a trumpet-like shape in which the outside is wider than the inside in cross-sectional view.

The opening 141 has dimensions corresponding to the notch portion 114. The opening 141 has an innermost bottom surface having a width of 10 μm or more in the Z direction and a depth of 100 μm or more from the end portion 110d of the substrate 110. Further, the width of the bottom surface of the opening 141 in the Z direction may be set to, for example, 250 μm or less, and the depth from the end portion 110d may be set to, for example, 5000 μm or less.

Figure 2A:
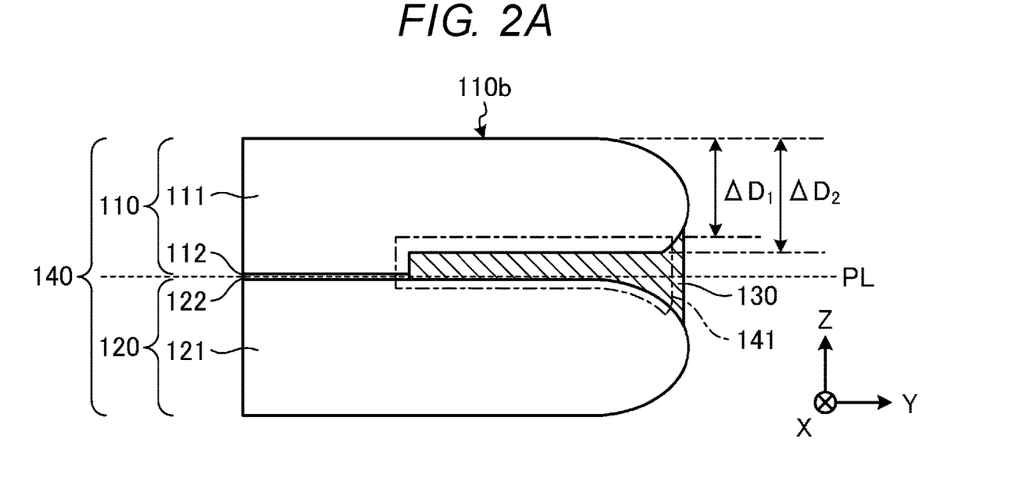
FIGS. 2A and 2B are cross-sectional views showing the manufacturing method of the semiconductor device according to the first embodiment.

In the process shown in FIG. 2A, the opening 141 is filled with the embedding member 130. As the embedding member 130, a substance having a relatively high viscosity may be used. As for the embedding member 130, for example, an organic adhesive containing a filler, or a silica-based inorganic adhesive containing a filler may be used. The organic adhesive used for the embedding member 130 may be a urethane resin, an epoxy resin, or the like. The filler is an aggregate for the purpose of reducing heat shrinkage of the embedding material to be filled, and is, for example, silica particles used as an abrasive. The embedding member 130 is in contact with the side surface and the bottom surface of the opening 141 and supports both the substrate 110 and the substrate 120. Alternatively, the embedding member 130 contacts the surface extending in the XY directions and the surface extending in the Z direction of the notch portion 114 (see FIG. 1C) of the substrate 110, and also contacts the peripheral edge region 120a2 of the substrate 120, thereby supporting both the substrate 110 and the substrate 120.

At this time, the opening 141 has a bottom surface located on the innermost side having a width of 10 μm or more in the Z direction and a depth of 100 μm or more from the end portion 110d of the substrate 110. As a result, when the opening 141 is filled with the embedding member 130, the embedding member 130 made of an appropriate material can be sufficiently filled in the opening 141. That is, the variation in selection of the embedding member 130 increases, and the filling performance, adhesion strength, and the like can be remarkably improved. For example, the opening 141 can be filled with the embedding member 130 by using a highly viscous substance for the embedding member 130. As a result, slimming is less likely to occur in a subsequent process such as heat treatment, and the state in which the embedding member 130 is filled in the opening 141 can be maintained.

Figure 2B:
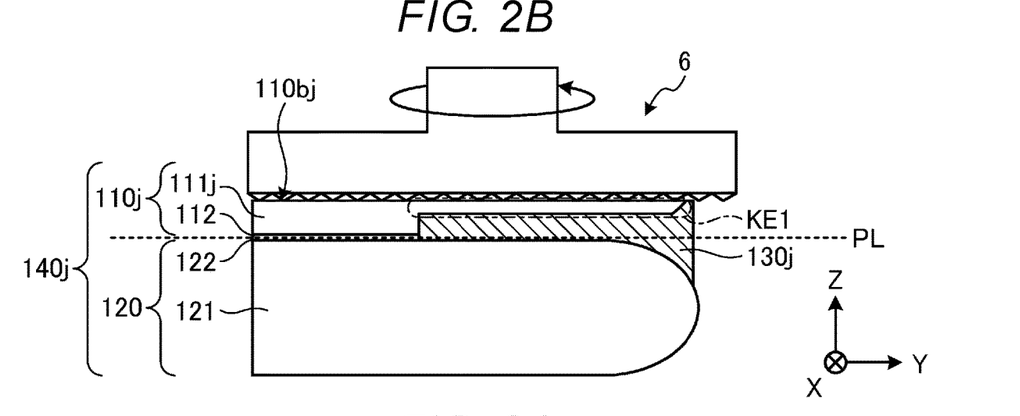

In the process shown in FIG. 2B, a grinder 6 of the polishing device is pressed against the back surface 110b of the substrate 110, and the grinder 6 rotates about an axis perpendicular to the contact surface. As a result, the back surface 110b of the substrate 110j is polished until a part of the embedding member 130j begins to be exposed. As a result, the substrate 110j in the stacked substrate 140j is thinned.

At this time, according to the fact that the end surface of the substrate 110 is a curved end surface 110c (see FIG. 1C), a knife edge KE1 having a substantially knife shape in the cross-sectional view can be formed in the vicinity of the end portion of the polished surface 110bj in the base portion 111j of the substrate 110j. For example, in the case of FIG. 2B, when the polishing thickness from the back surface 110b reaches $\Delta D_1$ (see FIG. 2A) such that a part of the embedding member 130j in the XY directions begins to be exposed, the outer end portion of the substrate 110j becomes the knife edge KE1 having a substantially knife shape in cross-sectional view. Although the knife edge KE1 is weak in strength, the embedding member 130 is in contact with the surface on the −Z side thereof and is supported by the embedding member 130j. Therefore, even if stress is applied to the knife edge KE1 from the grinder 6 or the like, the knife edge KE1 can be prevented from breaking and the knife edge KE1 can be prevented from becoming scraps.

Figure 3A:
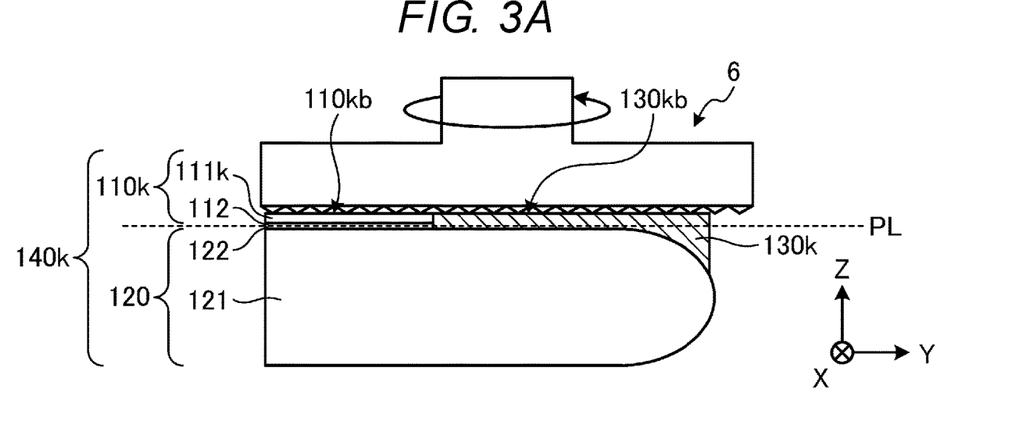
FIGS. 3A and 3B are cross-sectional views showing the manufacturing method of the semiconductor device according to the first embodiment.

In the process shown in FIG. 3A, the grinder 6 of the polishing device is continuously pressed against the back surface 110b of the substrate 110k, and the grinder 6 rotates about an axis perpendicular to the contact surface. As a result, the back surface 110b of the substrate 110 is polished until all of the embedding member 130k in the XY directions begins to be exposed. As a result, the substrate 110k in the stacked substrate 140k is further thinned.

At this time, since the knife edge KE1 is supported by the embedding member 130 (see FIG. 2B), the knife edge KE1 can be removed by polishing without turning into scraps. For example, in the case of FIG. 3A, the knife edge KE1 is in a state of being removed when the polishing thickness from the back surface 110b reaches $\Delta D_2$ (see FIG. 2A) such that the entire embedding member 130k in the XY directions is exposed. That is, since the knife edge KE1 is polished while being supported by the embedding member 130, it is possible to prevent the knife edge KE1 from being scattered as scraps (first scraps) in the polishing device. As a result, the maintenance burden such as cleaning of the polishing device can be reduced.

In the state where polishing is completed, the back surface 110kb of the substrate 110k and the back surface 130kb of the embedding member 130k are continuous and flat surfaces, respectively.

Figure 3B:
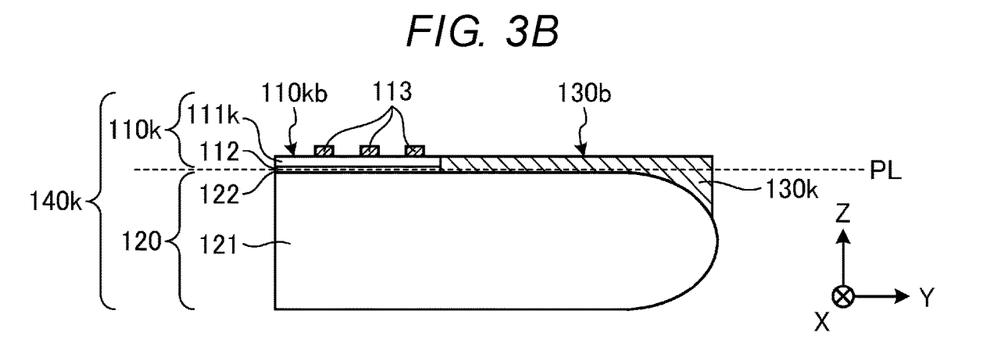

In the process shown in FIG. 3B, a plurality of electrodes 113 are formed on the back surface 110kb of the substrate 110k in the stacked substrate 140k. Each electrode 113 penetrates through the base portion 111k and is electrically connected to the device portion 112.

Figure 4A:
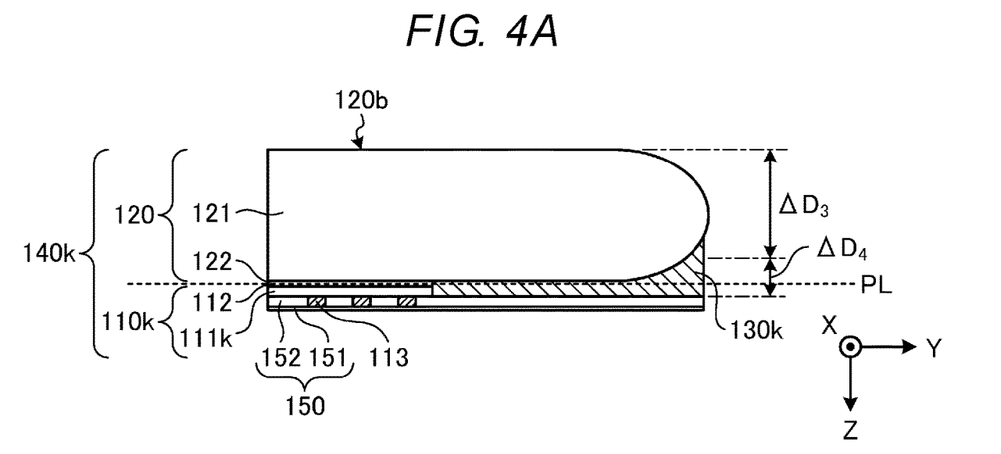
FIGS. 4A and 4B are cross-sectional views showing the manufacturing method of the semiconductor device according to the first embodiment.

In the process shown in FIG. 4A, a protective member 150 is attached to the back surface 110kb of the substrate 110k and the back surface 130kb of the embedding member 130k. The protective member 150 includes a base material 151 and an adhesive layer 152. The adhesive layer 152 is a layer in which an adhesive is applied to the front surface of the base material 151, and is interposed between the back surfaces 110kb and 130b and the base material 151 to adhere the base material 151 to the back surfaces 110kb and 130b. Thereby, when the back surface 120b of the substrate 120 is polished, the electrode 113 formed on the back surface 110kb can be protected. Further, since the back surfaces 110kb and 130kb to be attached are continuous flat surfaces, an inexpensive member (for example, a protective member 150 having a relatively thin thickness) can be adopted as the protective member 150, and the manufacturing cost can be reduced.

Figure 4B:
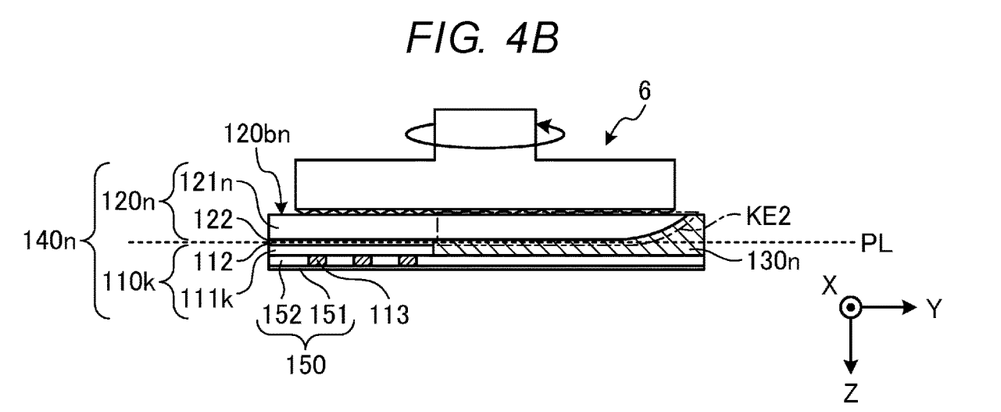

In the process shown in FIG. 4B, the grinder 6 of the polishing device is pressed against the back surface 120b of the substrate 120, and the grinder 6 rotates about an axis perpendicular to the contact surface. Thereby, the back surface 110b of the substrate 110 is polished until a part of the embedding member 130n begins to be exposed. As a result, the substrate 120n in the stacked substrate 140n is thinned.

At this time, in response to the curved end surface 110c (see FIG. 1A) of the substrate 110, a knife edge KE2 having a substantially knife shape in cross-sectional view can be generated in the vicinity of the end portion of the polished surface 110bj in the base portion 111j of the substrate 110j. For example, in the case of FIG. 4B, when the polishing thickness from the back surface 120b becomes the Z-direction thickness $\Delta D_3$ corresponding to the target Z-direction thickness $\Delta D_4$ of the stacked substrate 140n (see FIG. 4A), the outer end portion of the substrate 120n becomes the knife edge KE2 having a substantially knife shape in cross-sectional view. Although the knife edge KE2 is weak in strength, the embedding member 130n is in contact with the surface on the −Z side thereof, and is supported by the embedding member 130n. Therefore, even if stress is applied to the knife edge KE2 from the grinder 6 or the like, the knife edge KE2 can be prevented from breaking and the knife edge KE2 can be prevented from becoming scraps.

Figure 5A:
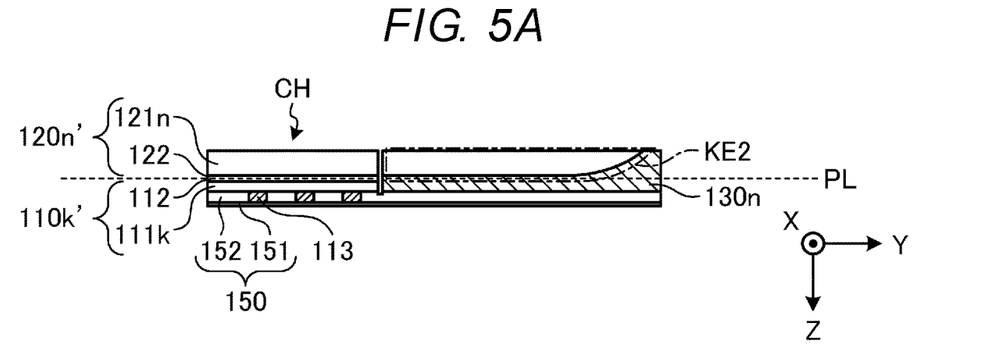
FIGS. 5A and 5B are cross-sectional views showing the manufacturing method of the semiconductor device according to the first embodiment.

In the process shown in FIG. 5A, the stacked substrate 140n is diced from the back surface 120bn (see FIG. 4B) side to the protective member 150 along the dicing region extending in the XY directions in a grid pattern. As a result, the stacked substrate 140 is divided into a plurality of chips CH and the knife edge KE2 is separated from each chip CH. In FIG. 5A, one chip CH divided from the stacked substrate 140 is illustrated. Each chip CH has a structure in which a substrate 110k' divided from the substrate 110k and a substrate 120n' divided from the substrate 120n are stacked. The substrate 110k is a substrate thinned in the processes of FIGS. 2A to 3A. The substrate 120n is a substrate thinned in the processes of FIGS. 4A to 4B.

At this time, the knife edge KE2 is supported by the embedding member 130n. Therefore, even if stress is applied to the knife edge KE2 from a dicing blade or the like, the knife edge KE2 can be prevented from being scattered and the knife edge KE2 can be prevented from becoming scraps.

Figure 5B:
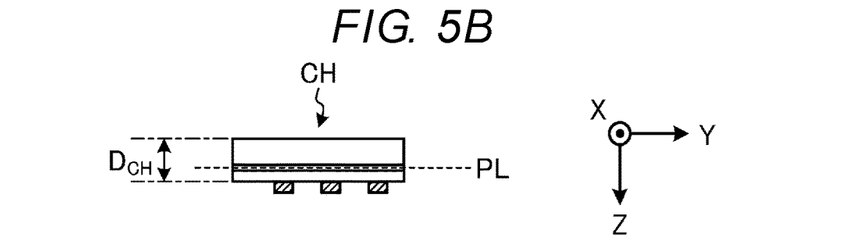

In the process shown in FIG. 5B, each chip CH can be mounted as a package by being picked up from the protective member 150 and sealed with a resin. At this time, since the chip CH has a structure in which the thinned substrate 110k' and the thinned substrate 120n' are stacked, the thickness $D_{CH}$ of the chip CH is maintained within the range of thickness allowed as a package. As a result, each chip CH can be appropriately packaged.

As described above, in the present embodiment, in the manufacturing method of the semiconductor device, a pre-trimming process to form the notch portion 114 in the peripheral edge region of the surface of one substrate 110 is performed, and the two substrates 110 and 120 are bonded together to form the stacked substrate 140, and then, the embedding member 130 is filled in the opening 141 formed on the side surface of the stacked substrate 140 according to the notch portion 114. As a result, the knife edges KE1 and KE2 can be prevented from becoming scraps in the subsequent polishing process, and it is possible to reduce the maintenance burden on the manufacturing apparatus.

Second Embodiment

Next, the semiconductor device 1 according to a second embodiment has a configuration in which the front surfaces of two substrates are bonded to each other, the back surface of one substrate is polished, and the semiconductor device 1 is manufactured as a stacked substrate. The semiconductor device 1 may have a configuration corresponding to the stacked substrate 140k obtained in the processes of FIGS. 1A to 3B in the first embodiment.

Figure 6:
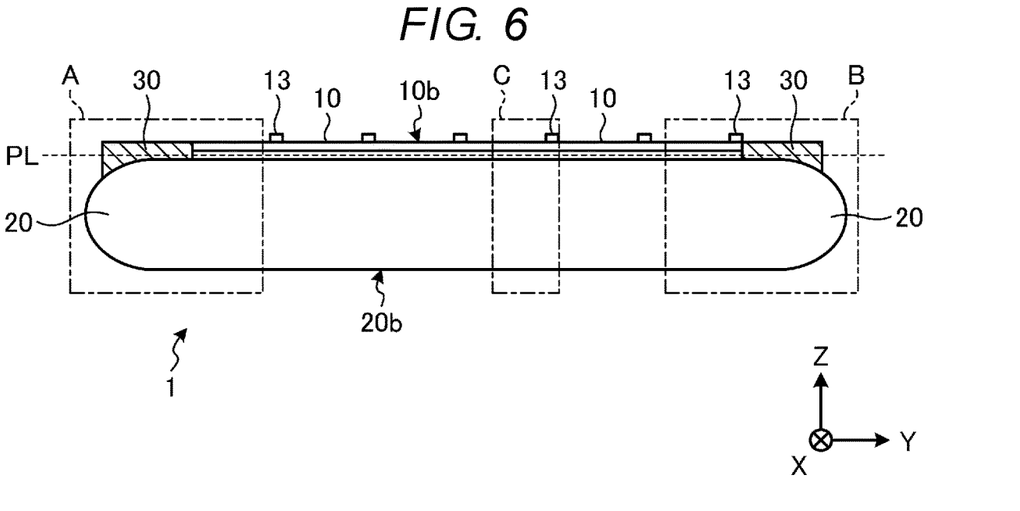
FIG. 6 is a cross-sectional view showing a configuration of a semiconductor device according to a second embodiment.
Figure 7:
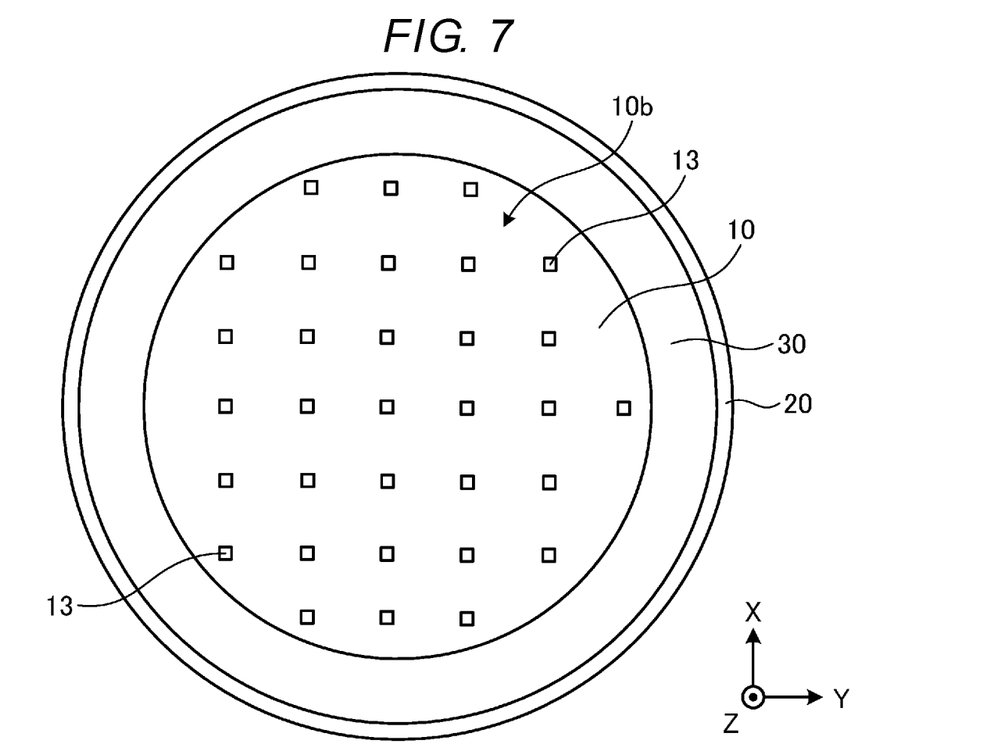
FIG. 7 is a plan view showing the configuration of the semiconductor device according to the second embodiment.

For example, the semiconductor device 1 is configured as shown in FIGS. 6 and 7. FIG. 6 is a cross-sectional view showing the configuration of the semiconductor device 1. FIG. 7 is a plan view showing the configuration of the semiconductor device 1. In the following, the direction perpendicular to the back surface 10b of the substrate 10 is defined as the Z direction, and the two directions orthogonal to each other in the plane perpendicular to the Z direction are defined as the X direction and the Y direction.

As shown in FIG. 6, the semiconductor device 1 includes the substrate 10, the substrate 20, and the embedding member 30. The semiconductor device 1 is configured as a stacked substrate in which the substrate 10 and the substrate 20 are bonded together. For example, a memory cell array is disposed on the substrate 10, a control circuit for controlling the memory cell array is disposed on the substrate 20, and the semiconductor device 1 may be a CBA (Chip Bonding Array) type device configured as a semiconductor storage device by bonding the substrate 10 and the substrate 20.

The substrate 10 and the embedding member 30 are disposed on the surface 20a, which is the +Z side surface of the substrate 20. The embedding member 30 is disposed on the outer side of the substrate 10 in the XY directions.

As shown in FIG. 7, the plane dimension of the substrate 10 is smaller than the plane dimension of the substrate 20. In the XY plan view, the substrate 20 includes the substrate 10 inside. A plurality of electrodes 13 are arranged two-dimensionally (for example, in a matrix) on the back surface 10b of the substrate 10. The embedding member 30 is disposed around the substrate 10 and surrounds the substrate 10. The back surface 10b of the substrate 10 is polished and configured. The thickness of the substrate 10 is thinner than the thickness of the substrate 20. For example, the thickness of the substrate 10 is thinner than half the thickness of the substrate 20.

Figure 8:
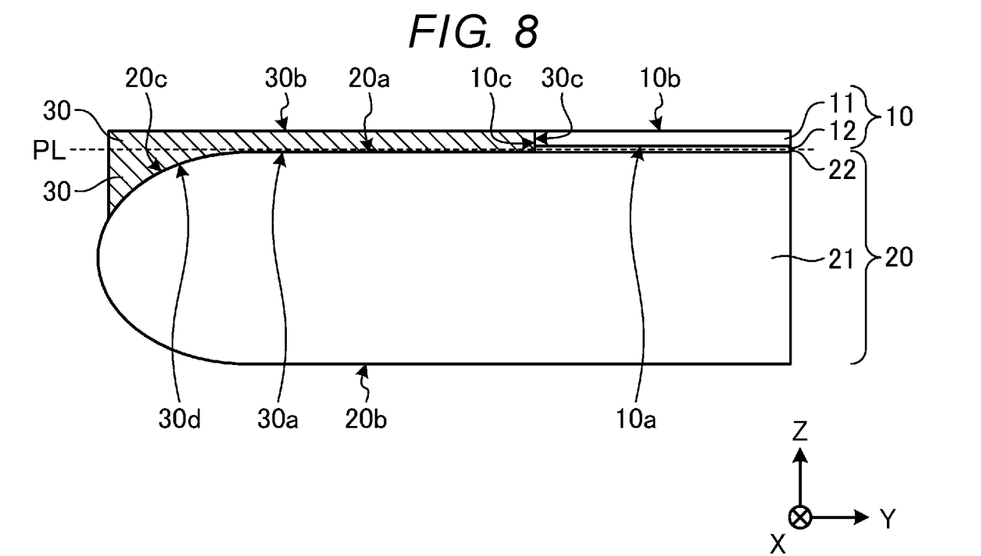
FIG. 8 is a cross-sectional view showing a configuration in the vicinity of a peripheral edge portion in the second embodiment.

As shown in FIG. 8, the substrate 10 includes a front surface 10a in contact with a front surface 20a of the substrate 20, and the substrate 20 includes the surface 20a in contact with the front surface 10a of the substrate 10. FIG. 8 is a cross-sectional view showing the configuration of the semiconductor device 1 and is an enlarged cross-sectional view of a portion A in FIG. 6. That is, the front surface 10a and the front surface 20a form the bonding surface PL of the substrate 10 and the substrate 20 as shown by the dotted line in FIGS. 1A to 1C. The front surface 20a of the substrate 20 is outside the substrate 10 in the XY directions and is covered with the embedding member 30. The front surface 30a of the embedding member 30 is in contact with the front surface 20a of the substrate 20 outside the substrate 10.

The side surface 10c of the substrate 10 and the side surface 30c of the embedding member 30 both extend in the XZ directions and are in contact with each other. Both the back surface 10b of the substrate 10 and the back surface 30b of the embedding member 30 extend flat in the XY directions and are continuous with each other. The heights of the back surface 10b of the substrate 10 and the back surface 30b of the embedding member 30 from the back surface 20b of the substrate 20 are equal to each other.

The substrate 20 includes the curved end surface 20c on the outer side of the surface 20a. The curved end surface 20c is curved so that the height from the back surface 20b decreases from the center of the substrate 20 toward the outer side in the portion on the +Z side. The curved end surface 20c is curved to be convex toward the +Z side in the portion on the +Z side. Most of the curved end surface 20c on the +Z side is covered with the embedding member 30. The embedding member 30 has the curved surface 30d in contact with the curved end surface 20c. The curved surface 30d is curved so that the height from the back surface 20b decreases from the center of the substrate 20 toward the outer side. The curved surface 30d is curved to be convex toward the +Z side.

Figure 9:
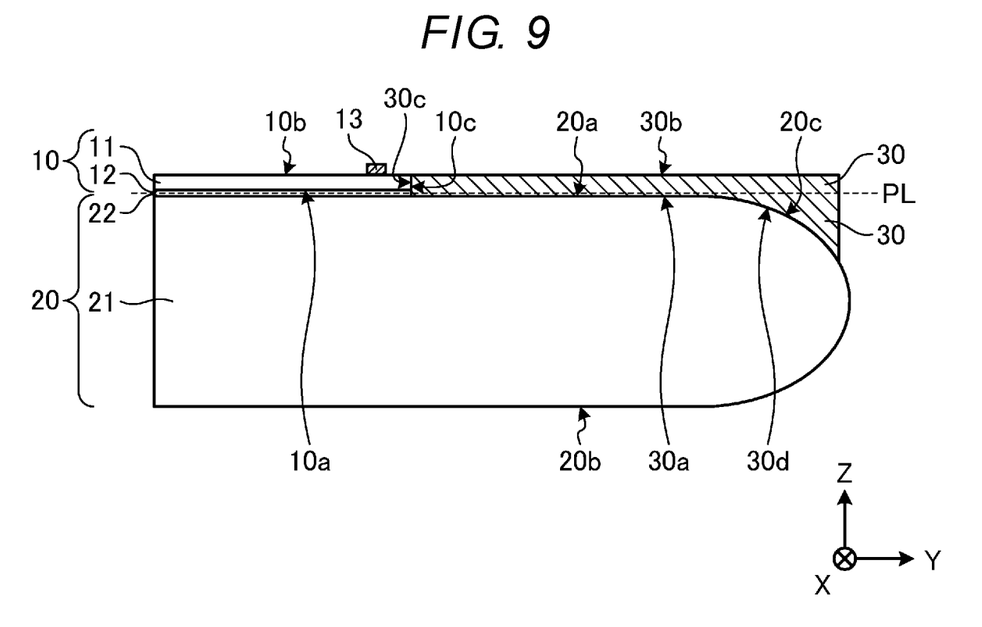
FIG. 9 is a cross-sectional view showing a configuration in the vicinity of another peripheral edge portion in the second embodiment.

As shown in FIG. 9, an electrode 13 is disposed on the back surface 10b of the substrate 10. FIG. 9 is a cross-sectional view showing the configuration of the semiconductor device 1and is an enlarged cross-sectional view of a portion B of FIG. 6. FIG. 8 shows a cross section without including the electrode 13, and FIG. 9 shows a cross section including the electrode 13.

Figure 10:
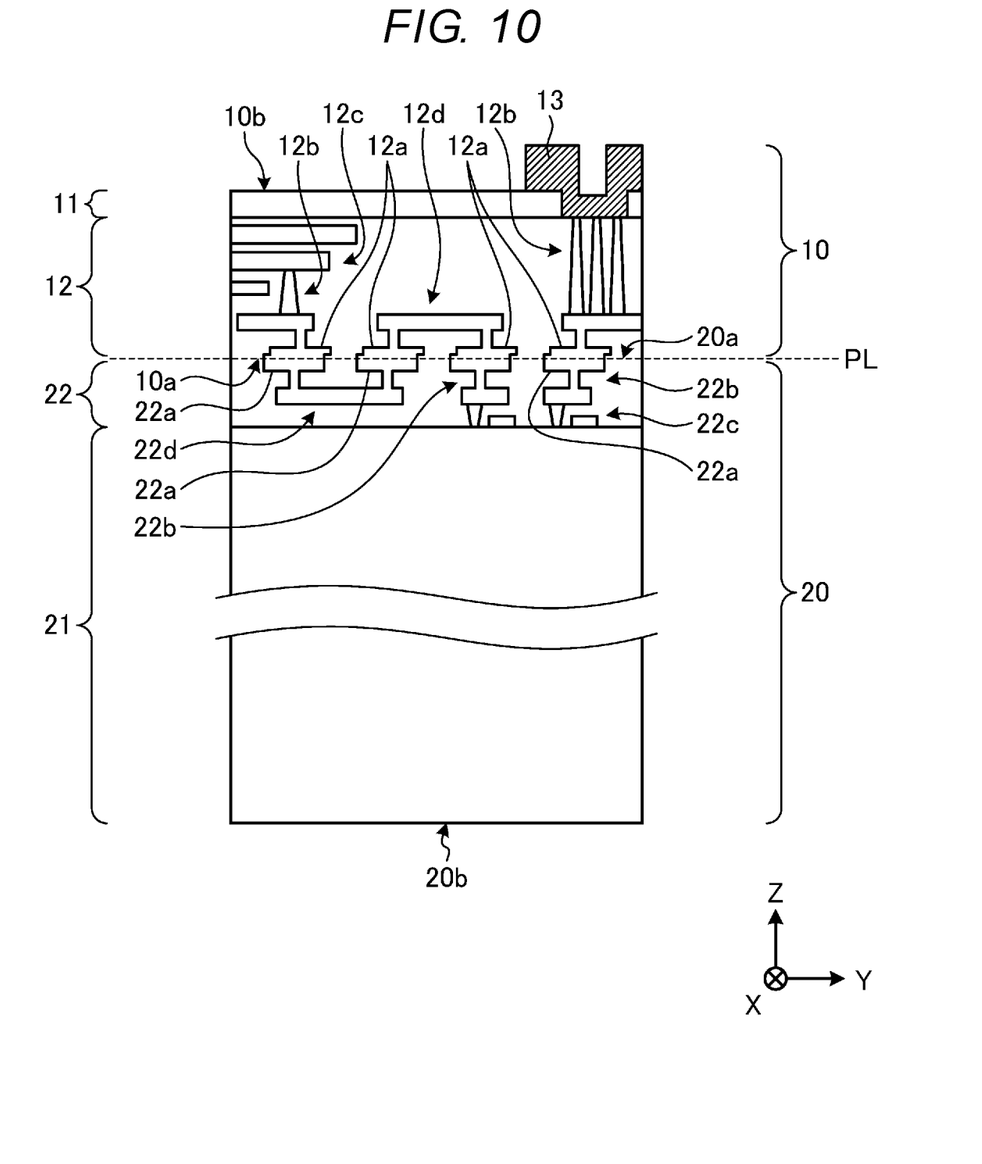
FIG. 10 is a cross-sectional view showing a configuration of a main part in the second embodiment.

As shown in FIG. 10, the electrode 13 penetrates the base portion 11 of the substrate 10 and is electrically connected to the device portion 12. FIG. 10 is a cross-sectional view showing the configuration of the semiconductor device 1 and is an enlarged cross-sectional view of a portion C of FIG. 6. The device portion 12 includes a bonding electrode 12a, a plug 12b, a memory device 12c, and a wiring 12d. The device portion 22 on the substrate 20 includes a bonding electrode 22a, a plug 22b, a control device 22c, and a wiring 22d. The bonding electrode 12a and the bonding electrode 22a are arranged at positions corresponding to each other, are directly bonded to each other, and are electrically connected to each other. For example, the electrode 13 can access the control device 22c via the plug 12b, the bonding electrode 12a, the bonding electrode 22a, and the plug 22b to transmit and receive signals such as command data with respect to the control device 22c. The control device 22c can access the memory device 12C via the plug 22b, the bonding electrode 22a, the bonding electrode 12a, the wiring 12d, the bonding electrode 12a, the bonding electrode 22a, the wiring 22d, the bonding electrode 22a, the bonding electrode 12a, and the plug 12b to read and write data from and to the memory device 12c. As a result, the semiconductor device 1 can function as a semiconductor storage device.

As described above, in the present embodiment, the semiconductor device 1 has, for example, a configuration corresponding to the stacked substrate 140k obtained in the processes of FIGS. 1A to 3B in the first embodiment. This makes it possible to configure a semiconductor device suitable for reducing the maintenance burden on the manufacturing apparatus.

Figure 11:
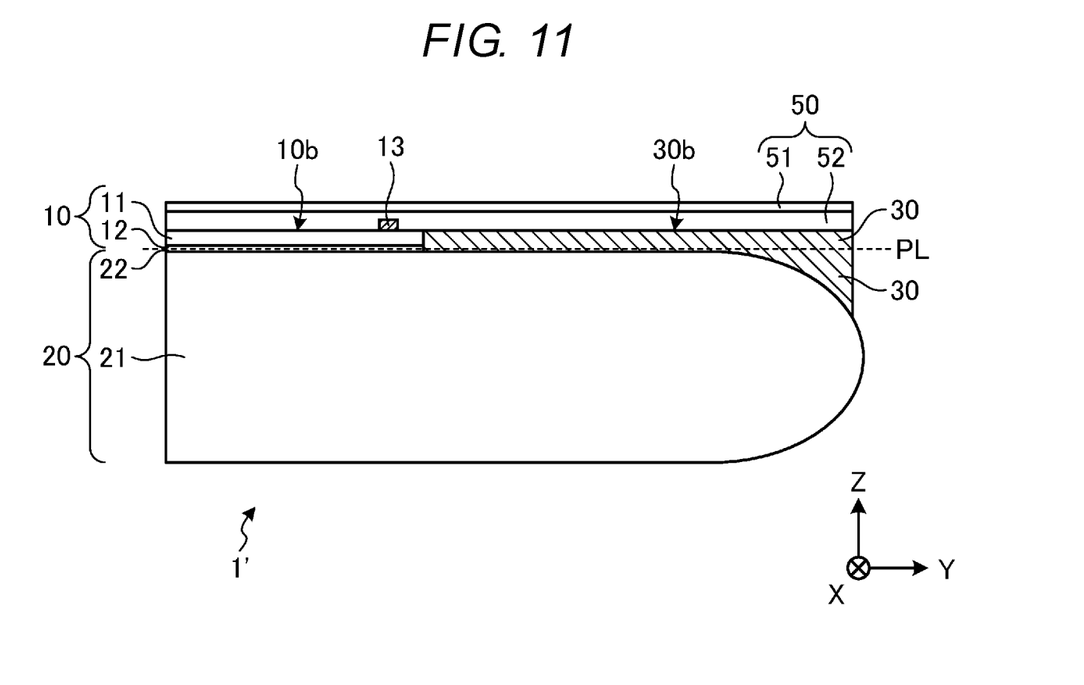
FIG. 11 is a cross-sectional view showing a configuration in the vicinity of a peripheral edge in a modification of the second embodiment.

The surface of the semiconductor device 1' may be protected by being covered with a protective member on the +Z side. The semiconductor device 1' may have a configuration corresponding to the stacked substrate 140k and the protective member 150 obtained in the processes of FIGS. 1A to 4A in the first embodiment. For example, the semiconductor device 1' can be configured as shown in FIG. 11. The semiconductor device 1' further includes a protective member 50. The protective member 50 includes abase material 51 and an adhesive layer 52. The adhesive layer 52 is a layer in which an adhesive is applied to the front surface of the base material 51, and is interposed between the back surfaces 10b and 30b and the base material 51 to adhere the base material 51 to the back surfaces 10b and 30b. Thereby, the electrode 13 disposed on the back surface 10b can be protected. That is, according to the configuration shown in FIG. 11, the semiconductor device 1' can be provided with the electrode 13 protected.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a first substrate having a front surface;
a second substrate having a front surface in contact with the front surface of the first substrate; and
an embedding member surrounding an outer edge of the first substrate and having a front surface that contacts the front surface of the second substrate, an inner side surface that contacts the outer edge of the first substrate, and a back surface that extends from the back surface of the first substrate, wherein
a first height extending from the back surface of the second substrate to the back surface of the first substrate and a second height extending from the back surface of the second substrate to the back surface of the embedding member are equal to each other, wherein
the back surface of the first substrate and the back surface of the embedding member are coplanar with each other.

2. The semiconductor device according to claim 1, wherein
the second substrate has a curved end surface, and
a portion of the front surface of the embedding member is in contact with the curved end surface of the second substrate.

3. The semiconductor device according to claim 1, further comprising:
a protective member that covers the back surface of the first substrate and the back surface of the embedding member.

4. The semiconductor device according to claim 1, wherein
a plurality of electrodes are disposed on the back surface of the first substrate.

5. The semiconductor device according to claim 4, wherein at least a subset of the plurality of electrodes collectively penetrate through the first substrate.

6. The semiconductor device according to claim 1, wherein the back surface of the first substrate and the back surface of the embedding member are substantially flat.

7. The semiconductor device according to claim 1, wherein the embedding member includes one of an organic adhesive containing a filler or a silica-based inorganic adhesive containing the filler.

8. The semiconductor device according to claim 7, wherein the organic adhesive includes one of a urethane resin or an epoxy resin.

* * * * *